United States Patent
Iinuma

(10) Patent No.: US 10,147,736 B2
(45) Date of Patent: Dec. 4, 2018

(54) SEMICONDUCTOR MEMORY DEVICE AND METHOD FOR MANUFACTURING SAME

(71) Applicant: Toshiba Memory Corporation, Minato-ku (JP)

(72) Inventor: Toshihiko Iinuma, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 21 days.

(21) Appl. No.: 14/934,611

(22) Filed: Nov. 6, 2015

(65) Prior Publication Data
US 2017/0069650 A1   Mar. 9, 2017

Related U.S. Application Data

(60) Provisional application No. 62/213,829, filed on Sep. 3, 2015.

(51) Int. Cl.
| | |
|---|---|
| H01L 27/115 | (2017.01) |
| H01L 23/532 | (2006.01) |
| H01L 21/768 | (2006.01) |
| H01L 23/528 | (2006.01) |
| H01L 27/11582 | (2017.01) |
| H01L 27/11565 | (2017.01) |

(52) U.S. Cl.
CPC .. H01L 27/11582 (2013.01); H01L 21/76802 (2013.01); H01L 21/76831 (2013.01); H01L 21/76877 (2013.01); H01L 27/11565 (2013.01)

(58) Field of Classification Search
None
See application file for complete search history.

(56) References Cited

U.S. PATENT DOCUMENTS

| | | | |
|---|---|---|---|
| 8,203,211 B2 | 6/2012 | Jeong et al. | |
| 8,653,585 B2 | 2/2014 | Youm et al. | |
| 8,896,123 B2 | 11/2014 | Jeong et al. | |
| 8,946,665 B2 | 2/2015 | Shim et al. | |
| 9,082,655 B2 | 7/2015 | Youm et al. | |
| 9,099,349 B2 | 8/2015 | Kofuji et al. | |
| 2015/0076587 A1 | 3/2015 | Jeong et al. | |
| 2015/0093865 A1 | 4/2015 | Shim et al. | |
| 2015/0179662 A1* | 6/2015 | Makala | H01L 27/11582 257/314 |

(Continued)

*Primary Examiner* — Su C Kim
*Assistant Examiner* — David S Wilbert
(74) *Attorney, Agent, or Firm* — Oblon, McClelland, Maier & Neustadt, L.L.P.

(57) ABSTRACT

According to one embodiment, a semiconductor memory device includes a substrate; a stacked body including a plurality of electrode layers; a semiconductor film extending in stacking direction of the stacked body; an interconnect layer extending in the stacking direction of the stacked body and a first direction crossing the stacking direction; and an insulating film. The interconnect layer includes: a core film extending in the stacking direction and the first direction; an intermediate film provided integrally between the core film and the plurality of electrode layers and between the core film and the substrate; and a first conductive film provided integrally between the intermediate film and the plurality of electrode layers and between the intermediate film and the substrate, being in contact with the substrate, and having an upper surface flush with an upper surface of the intermediate film.

9 Claims, 10 Drawing Sheets

(56) References Cited

U.S. PATENT DOCUMENTS

2016/0086969 A1* 3/2016 Zhang .................. H01L 23/528
  257/314
2016/0141419 A1* 5/2016 Baenninger ....... H01L 27/11524
  257/314
2016/0218059 A1* 7/2016 Nakada ............. H01L 27/11556
2016/0329343 A1* 11/2016 Pachamuthu ..... H01L 27/11582

* cited by examiner

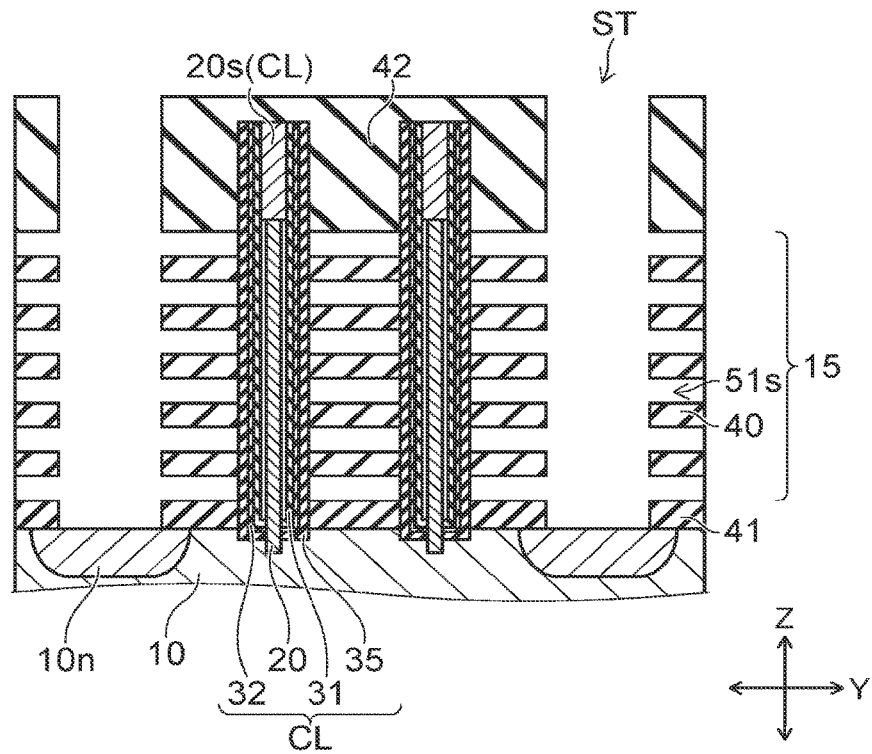
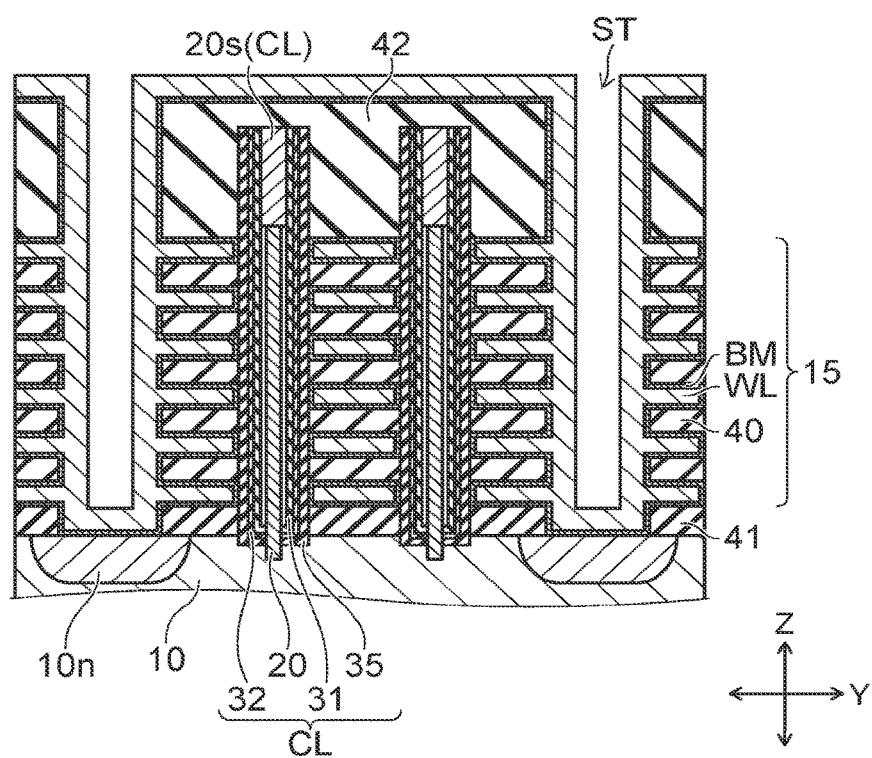

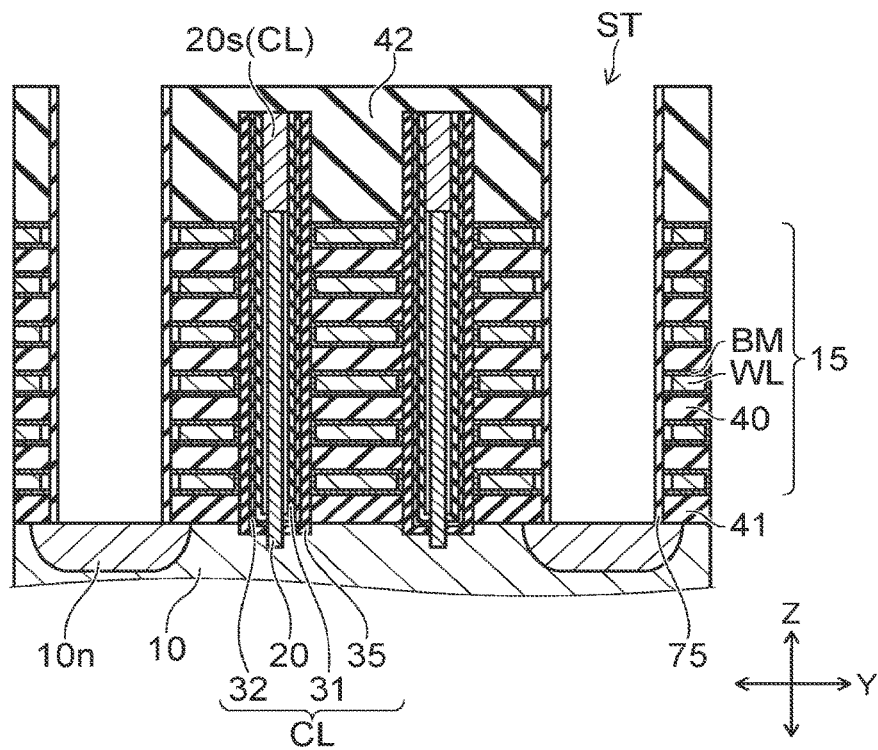
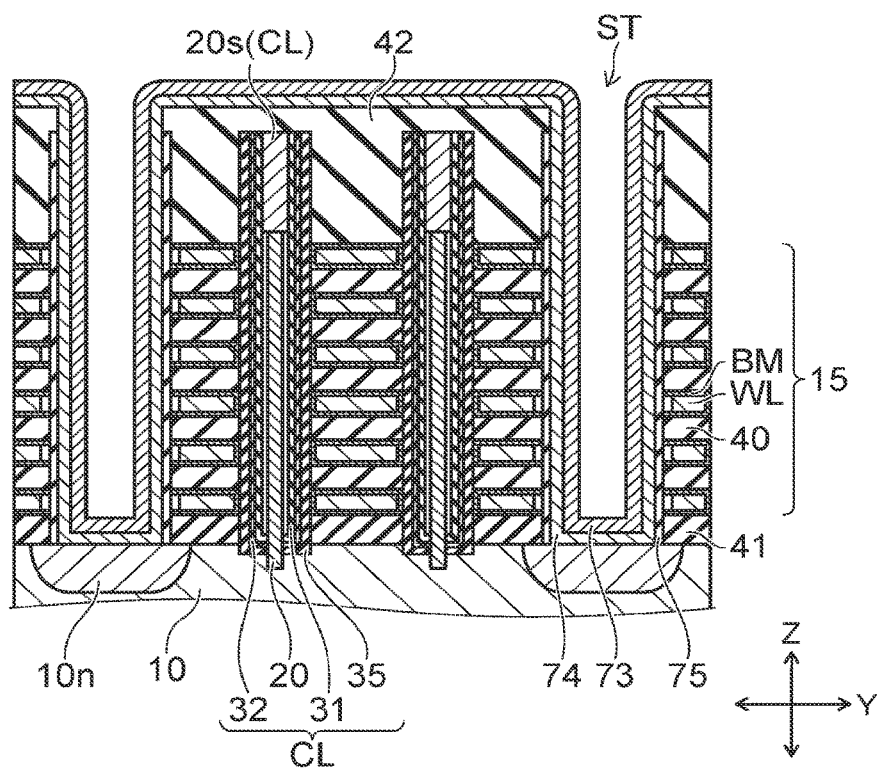

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/213,829 field on Sep. 3, 2015; the entire contents of which are incorporated herein by reference.

FIELD

Embodiments described herein relate generally to a semiconductor memory device and a method for manufacturing same.

BACKGROUND

A memory device of the three-dimensional structure has been proposed. The memory device includes a stacked body of a plurality of electrode layers stacked with spacing. The electrode layer functions as a control gate in a memory cell. A memory hole is formed in the stacked body. A silicon body constituting a channel is provided on the sidewall of the memory hole via a charge storage film.

There is concern in device manufacturing about the increase of the amount of warpage of the support substrate (silicon substrate) due to the increase of stress by the aforementioned stacked body.

BRIEF DESCRIPTION OF THE DRAWINGS

FIG. 4A to FIG. 7B are schematic sectional views showing a method for manufacturing the semiconductor memory device of the first embodiment;

DETAILED DESCRIPTION

Figure 1:
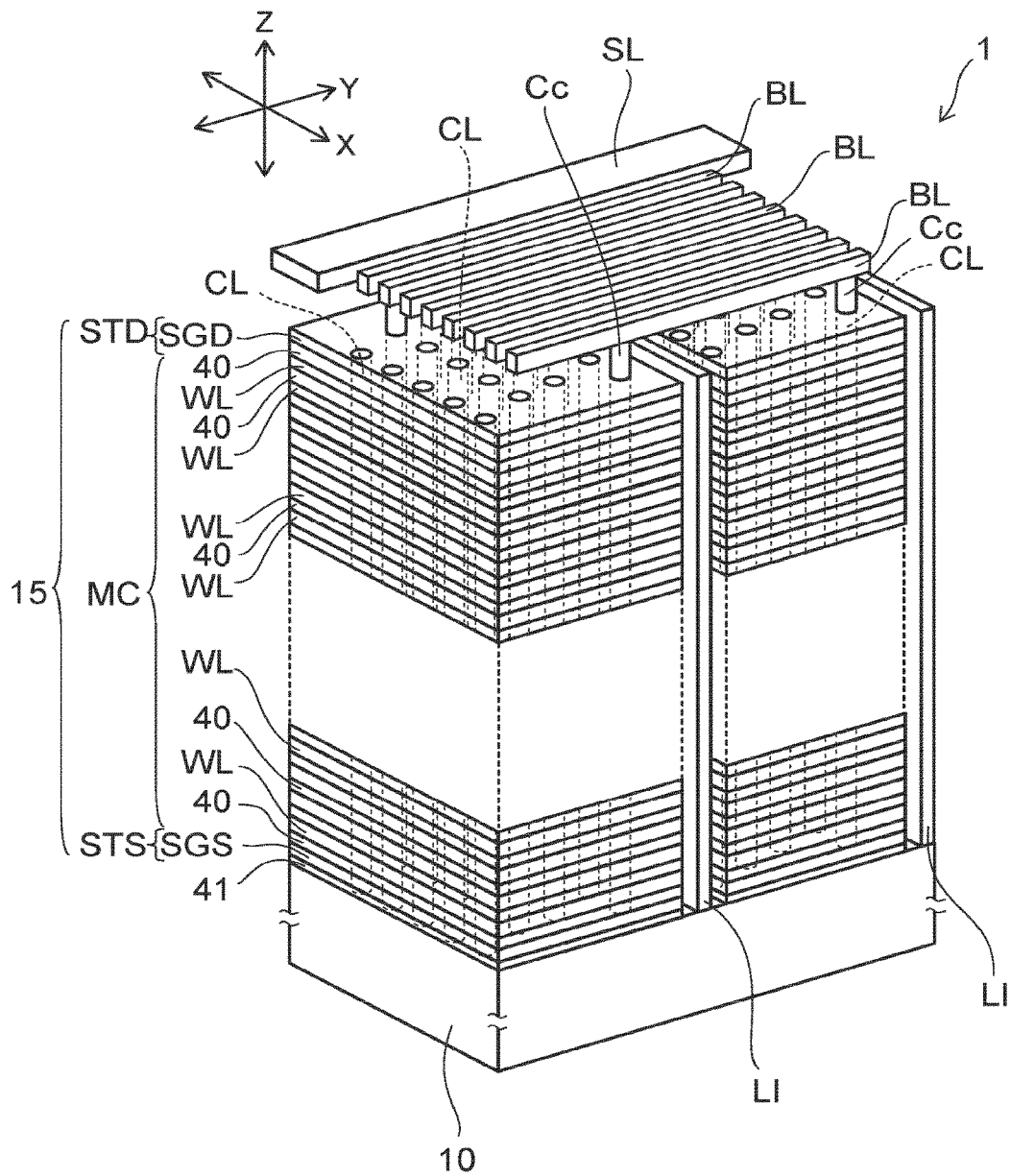
FIG. 1 is a schematic perspective view of a memory cell array of a first embodiment.

According to one embodiment, a semiconductor memory device includes a substrate; a stacked body provided on the substrate and including a plurality of electrode layers each stacked with spacing; a semiconductor film provided in the stacked body, extending in stacking direction of the stacked body, and electrically connected to the substrate; an interconnect layer provided in the stacked body, extending in the stacking direction of the stacked body and a first direction crossing the stacking direction, and electrically connected to the semiconductor film via the substrate; and an insulating film. The interconnect layer includes: a core film extending in the stacking direction and the first direction; an intermediate film provided integrally between the core film and the plurality of electrode layers and between the core film and the substrate; and a first conductive film provided integrally between the intermediate film and the plurality of electrode layers and between the intermediate film and the substrate, being in contact with the substrate, and having an upper surface flush with an upper surface of the intermediate film. The insulating film is provided between the first conductive film and the plurality of electrode layers and extending in the stacking direction and the first direction.

Embodiments will now be described with reference to the drawings. In the drawings, like elements are labeled with like reference numerals.

First Embodiment

An example of the configuration of a memory cell array 1 of this embodiment is described with reference to FIG. 1.

FIG. 1 is a schematic perspective view of the memory cell array 1 of this embodiment. In FIG. 1, insulating layers and the like on the stacked body are not shown for clarity of illustration.

In FIG. 1, two directions orthogonal to each other are referred to as X-direction (first direction) and Y-direction (second direction). The direction orthogonal to the X-direction and the Y-direction (X-Y plane) is referred to as Z-direction (stacking direction). A plurality of electrode layers WL is stacked in the Z-direction.

As shown in FIG. 1, the memory cell array 1 includes a substrate 10, a stacked body 15, a plurality of columnar parts CL, an interconnect layer LI, and an upper wiring. FIG. 1 shows a bit line BL and a source layer SL as the upper wiring.

The stacked body 15 is provided on the substrate 10 via an insulating layer 41. The stacked body 15 includes a source side select gate SGS, a drain side select gate SGD, a plurality of electrode layers WL, and a plurality of insulating layers 40.

The source side select gate SGS is provided in the lowermost layer of the stacked body 15. The drain side select gate SGD is provided in the uppermost layer of the stacked body 15.

The plurality of electrode layers WL is each stacked with spacing. The plurality of insulating layers 40 is provided between the plurality of electrode layers WL. A barrier film BM is provided on the upper surface, lower surface, and side surface of the plurality of electrode layers WL (see FIG. 2). The number of electrode layers WL shown in the figure is illustrative only. The number of electrode layers WL is arbitrary.

The electrode layer WL includes a metal. The electrode layer WL includes at least one of e.g. tungsten, molybdenum, titanium nitride, and tungsten nitride. The electrode layer WL may include silicon or metal silicide. The source side select gate SGS and the drain side select gate SGD include the same material as the electrode layer WL. The insulating layer 40 includes e.g. silicon oxide film. The barrier film BM includes e.g. titanium. The barrier film BM includes a stacked film of titanium and titanium nitride.

The thickness of the drain side select gate SGD and the thickness of the source side select gate SGS are thicker than e.g. the thickness of one electrode layer WL. The drain side select gate SGD and the source side select gate SGS may be provided in a plurality. The thickness of the drain side select gate SGD and the thickness of the source side select gate SGS may be equal to or thinner than the thickness of one electrode layer WL. In this case, the drain side select gate SGD and the source side select gate SGS may be provided in a plurality as described above. The term "thickness" used herein refers to the thickness in the stacking direction (Z-direction) of the stacked body 15.

The stacked body 15 includes a plurality of columnar parts CL extending in the Z-direction. The columnar part CL is provided like e.g. a circular column or elliptical column. The plurality of columnar parts CL is provided in e.g. a zigzag pattern. Alternatively, the plurality of columnar parts CL may be provided in a square lattice along the X-direction and the Y-direction. The columnar part CL is electrically connected to the substrate 10.

Figure 2:
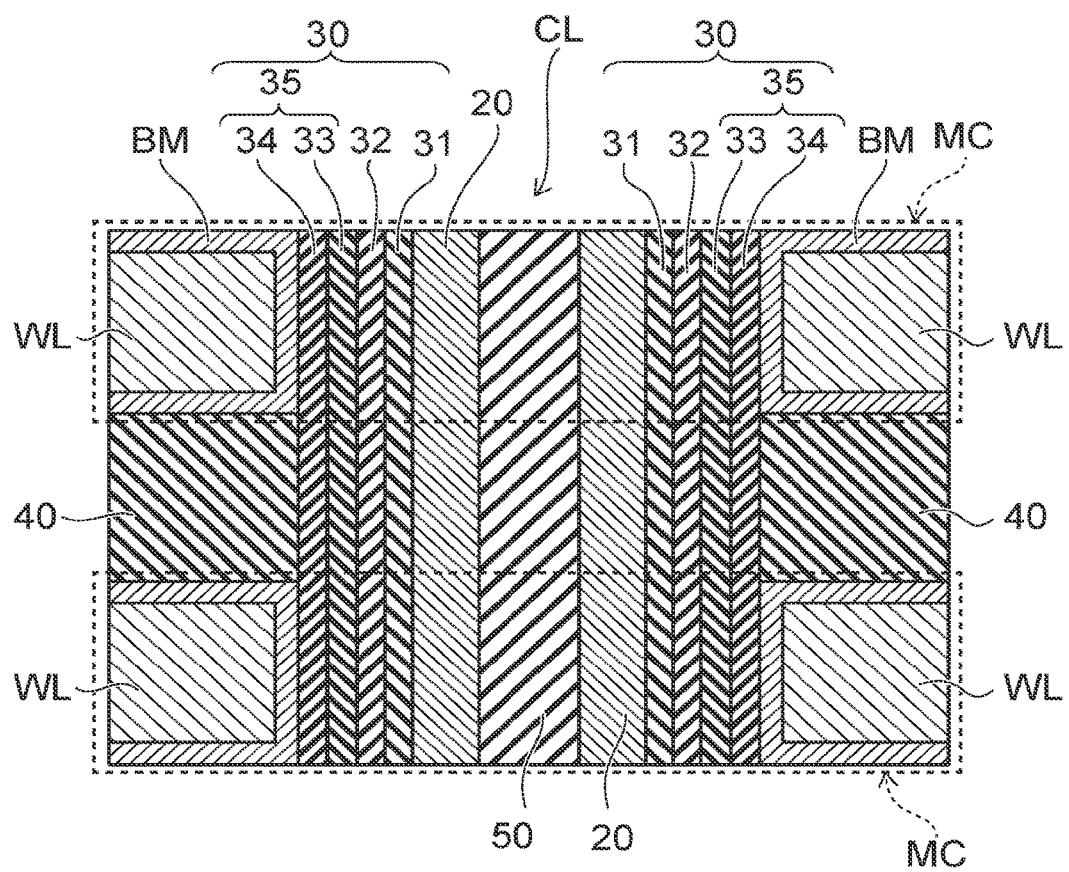
FIG. 2 is an enlarged schematic sectional view of a columnar part of the first embodiment.

The columnar part CL includes a channel body 20, a memory film 30, and a core insulating film 50 shown in FIG. 2. The memory film 30 is provided between the stacked body 15 and the channel body 20. The memory film 30 and the channel body 20 extend in the Z-direction.

The core insulating film 50 is provided inside the channel body 20. The channel body 20 may be shaped like e.g. a column. For instance, the core insulating film 50 may not be provided inside the channel body 20.

The channel body 20 is e.g. a semiconductor film composed primarily of silicon. The core insulating film 50 includes e.g. silicon oxide film, and may include an air gap.

The stacked body 15 includes an interconnect layer LI extending in the X-direction and the Z-direction in the stacked body 15. The interconnect layer LI is sandwiched by the stacked body 15. The detailed configuration of the interconnect layer LI will be described later. The lower end of the interconnect layer LI is electrically connected to the channel body 20 (semiconductor film) in the columnar part CL via the substrate 10.

The interconnect layer LI is electrically connected to a control circuit, not shown, via the source layer SL above the interconnect layer LI.

A plurality of bit lines BL is provided on the stacked body 15. The plurality of bit lines BL is separated from each other in the X-direction and extends in the Y-direction.

The upper end of the channel body 20 is electrically connected to the bit line BL via the contact part Cc. The lower end side of the channel body 20 is in contact with the substrate 10.

A plurality of channel bodies 20 each selected from one of the plurality of columnar parts CL separated in the Y-direction by the interconnect layer LI are electrically connected to one common bit line BL.

A drain side select transistor STD is provided in the upper end part of the columnar part CL. A source side select transistor STS is provided in the lower end part of the columnar part CL.

The memory cell MC, the drain side select transistor STD, and the source side select transistor STS are vertical transistors in which a current flows in the stacking direction of the stacked body 15.

The select gate SGD, SGS functions as a gate electrode of the corresponding select transistor STD, STS, i.e., a select gate. An insulating film functioning as a gate insulating film of the select transistor STD, STS is provided between the corresponding select gate SGD, SGS and the channel body 20.

A plurality of memory cells MC is provided between the drain side select transistor STD and the source side select transistor STS. Each electrode layer WL serves as a control gate of the corresponding memory cell MC. The plurality of memory cells MC is each stacked with spacing.

The plurality of memory cells MC, the drain side select transistor STD, and the source side select transistor STS are series connected via the channel body 20 and constitute one memory string. Such memory strings are arranged in e.g. a zigzag pattern in the plane direction parallel to the X-Y plane. Thus, a plurality of memory cells MC is provided three-dimensionally in the X-direction, the Y-direction, and the Z-direction.

The semiconductor memory device of this embodiment can electrically and freely erase/write data and retain its memory content even when powered off.

An example of the memory cell MC of the embodiment is described with reference to FIG. 2.

FIG. 2 is an enlarged schematic sectional view of part of the columnar part CL of the embodiment.

The memory cell MC is e.g. of the charge trap type. The memory cell MC includes an electrode layer WL, a memory film 30, a channel body 20, and a core insulating film 50.

The channel body 20 functions as a channel in the memory cell MC. The electrode layer WL functions as a control gate of the memory cell MC. The charge storage film 32 functions as a data storage layer for accumulating charge injected from the channel body 20. That is, the memory cell MC is formed in the crossing portion of the channel body 20 and each electrode layer WL. The memory cell MC has a structure in which the control gate surrounds the channel.

The memory film 30 includes e.g. a block insulating film 35, a charge storage film 32, and a tunnel insulating film 31. The block insulating film 35 is in contact with the electrode layer WL. The tunnel insulating film 31 is in contact with the channel body 20. The charge storage film 32 is provided between the block insulating film 35 and the tunnel insulating film 31.

The block insulating film 35 prevents the charge accumulated in the charge storage film 32 from diffusing into the electrode layer WL. The block insulating film 35 includes at least one of e.g. hafnium, aluminum, zirconium, and lanthanum. The block insulating film 35 is made of a material having higher permittivity (high dielectric oxide film, high-k film) than silicon nitride film.

The block insulating film 35 includes e.g. a cap film 34 and a block film 33. The block film 33 is placed between the cap film 34 and the charge storage film 32. The block film 33 is e.g. a silicon oxide film.

The cap film 34 is provided in contact with the electrode layer. The cap film 34 is a film having higher permittivity than the block film 33. The cap film 34 includes at least one of e.g. hafnium, aluminum, zirconium, and lanthanum described above. The cap film 34 is made of at least one of e.g. silicon nitride film and aluminum oxide. Providing the cap film 34 in contact with the electrode layer WL can suppress back tunneling electrons injected from the electrode layer WL at erase time. That is, the block insulating film 35 is a stacked film of silicon oxide film and one of silicon nitride film and high dielectric oxide film. This can enhance the charge blocking capability.

The charge storage film 32 includes a large number of trap sites for trapping charge. The charge storage film 32 includes at least one of e.g. silicon nitride film and hafnium oxide.

The tunnel insulating film 31 serves as a potential barrier when charge is injected from the channel body 20 into the charge storage film 32, or when the charge accumulated in the charge storage film 32 is diffused into the channel body 20. The tunnel insulating film 31 is e.g. a silicon oxide film.

Alternatively, the tunnel insulating film 31 may be a stacked film (ONO film) of the structure in which a silicon nitride film is sandwiched by a pair of silicon oxide films. The tunnel insulating film 31 made of ONO film enables erase operation at lower electric field than a monolayer of silicon oxide film.

The configuration of part of the semiconductor memory device of the embodiment is described with reference to FIGS. 3A and 3B.

Figure 3A:
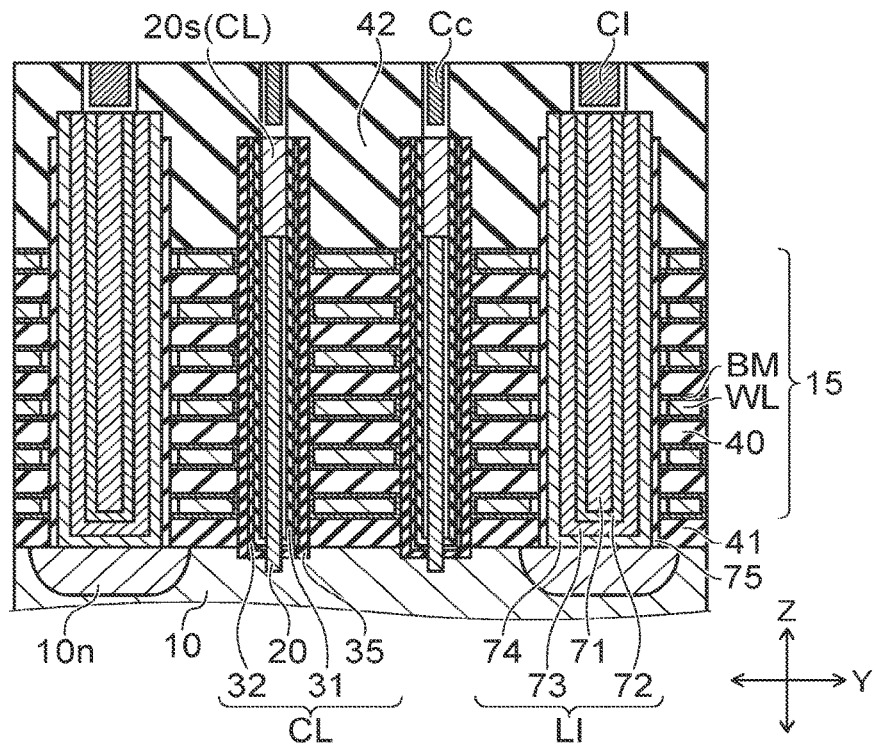
FIG. 3A is a schematic sectional view of the semiconductor memory device of the first embodiment.

FIG. 3A is a schematic sectional view of part of the memory cell array 1 of the embodiment. FIG. 3B is a schematic plan view with reference to the upper surface of the interconnect layer LI. The schematic sectional view of the memory cell array 1 in FIG. 3A corresponds to A-A' in FIG. 3B. The core insulating film 50 and the configuration on the contact part Cc, for instance, are not shown in FIG. 3A. The contact part CI in FIG. 3B is not provided on the same cross section as the contact part Cc. That is, the depicted contact part CI is provided on a cross section displaced in the depth direction. This also applies to the subsequent figures.

As shown in FIG. 3A, the interconnect layer LI includes a core film 71, an intermediate film 73, a first conductive film 74, and a second conductive film 72. An insulating film 75 is provided between the interconnect layer LI and the stacked body 15. The core film 71, the intermediate film 73, the first conductive film 74, the second conductive film 72, and the insulating film 75 each extend in the Z-direction and the X-direction. The core film 71, the intermediate film 73, the first conductive film 74, and the second conductive film 72 are electrically connected to each other.

The core film 71 is provided in the innermost of the interconnect layer LI in the Y-direction. That is, in the Y-direction, the distance between the core film 71 and the plurality of electrode layers WL is larger than the distance between each of the other films 72-74 and the plurality of electrode layers WL.

The intermediate film 73 is provided integrally between the core film 71 and the plurality of electrode layers WL and between the lower surface of the core film 71 and the substrate 10. The intermediate film 73 is separated from the core film 71.

The first conductive film 74 is provided integrally between the intermediate film 73 and the plurality of electrode layers WL and between the lower surface of the intermediate film 73 and the substrate 10. The first conductive film 74 is separated from the core film 71 via the intermediate film 73. The first conductive film 74 is in contact with the semiconductor part 10n of the substrate 10 and the intermediate film 73. The first conductive film 74 covers the outer side surface and lower surface of the intermediate film 73.

The second conductive film 72 is provided integrally between the core film 71 and the intermediate film 73 and between the lower surface of the core film 71 and the lower surface of the intermediate film 73. The second conductive film 72 is in contact with the core film 71 and the intermediate film 73. The second conductive film 72 is separated from the first conductive film 74 via the intermediate film 73. The second conductive film 72 covers the side surface and lower surface of the core film 71. The outer side surface and the lower surface of the second conductive film 72 are covered with the intermediate film 73.

The insulating film 75 is provided between the first conductive film 74 and the plurality of electrode layers WL. The insulating film 75 is not provided between the lower surface of the first conductive film 74 and the substrate 10. That is, the insulating films 75 are separated in the Y-direction across the first conductive film 74.

Figure 3B:
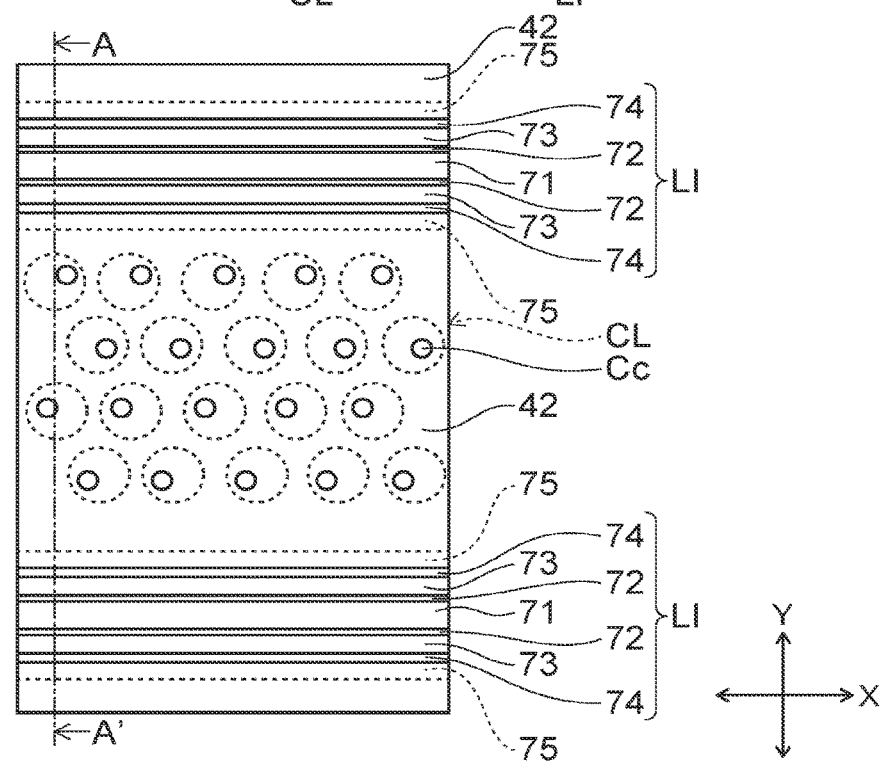
FIG. 3B is a schematic plan view of the semiconductor memory device of the first embodiment.

As shown in FIGS. 3A and 3B, the upper surface of the core film 71, the upper surface of the intermediate film 73, the upper surface of the first conductive film 74, and the upper surface of the second conductive film 72 are provided on the same plane. The maximum thickness of the first conductive film 74 is thicker than the maximum thickness of the intermediate film 73. The maximum thickness of the intermediate film 73 is thicker than the maximum thickness of the second conductive film 72. The maximum thickness of the second conductive film 72 is thicker than the maximum thickness of the core film 71. The term "thickness" used herein refers to the thickness of the film provided in the Z-direction.

The core film 71 and the intermediate film 73 have conductivity. The core film 71 includes a conductive film having a tensile stress. The core film 71 is made of a metal easily formed by CVD (chemical vapor deposition), such as tungsten and molybdenum. The intermediate film 73 includes a conductive film having a compressive stress. The intermediate film 73 is made of e.g. polysilicon film formed by CVD. The specific resistance of the core film 71 is lower than the specific resistance of the intermediate film 73.

Alternatively, for instance, the material of the core film 71 and the material of the intermediate film 73 described above may be interchanged. That is, the core film 71 includes a conductive film having a compressive stress. The core film 71 is made of e.g. polysilicon film formed by CVD. The intermediate film 73 includes a conductive film having a tensile stress. The intermediate film 73 is made of a metal easily formed by CVD, such as tungsten and molybdenum. In this case, the specific resistance of the core film 71 is higher than the specific resistance of the intermediate film 73.

The first conductive film 74 and the second conductive film 72 include the same material, such as titanium and tantalum. The first conductive film 74 and the second conductive film 72 are made of e.g. a stacked film of a titanium-containing film and a titanium nitride film.

The interconnect layer LI electrically connects the contact parts CI. The contact parts CI are provided in a plurality on the interconnect layers LI. The plurality of contact parts CI is separated from each other in the X-direction.

The contact part CI is in contact with at least one of the core film 71, the intermediate film 73, the first conductive film 74, and the second conductive film 72. Thus, the contact part CI is electrically connected to the channel body 20 via the interconnect layer LI and the substrate 10. The contact part CI is made of e.g. a conductor having a stacked structure of conductive films of a barrier metal (BM) made of titanium and titanium nitride film and a high-melting-point metal such as tungsten.

Figure 10:
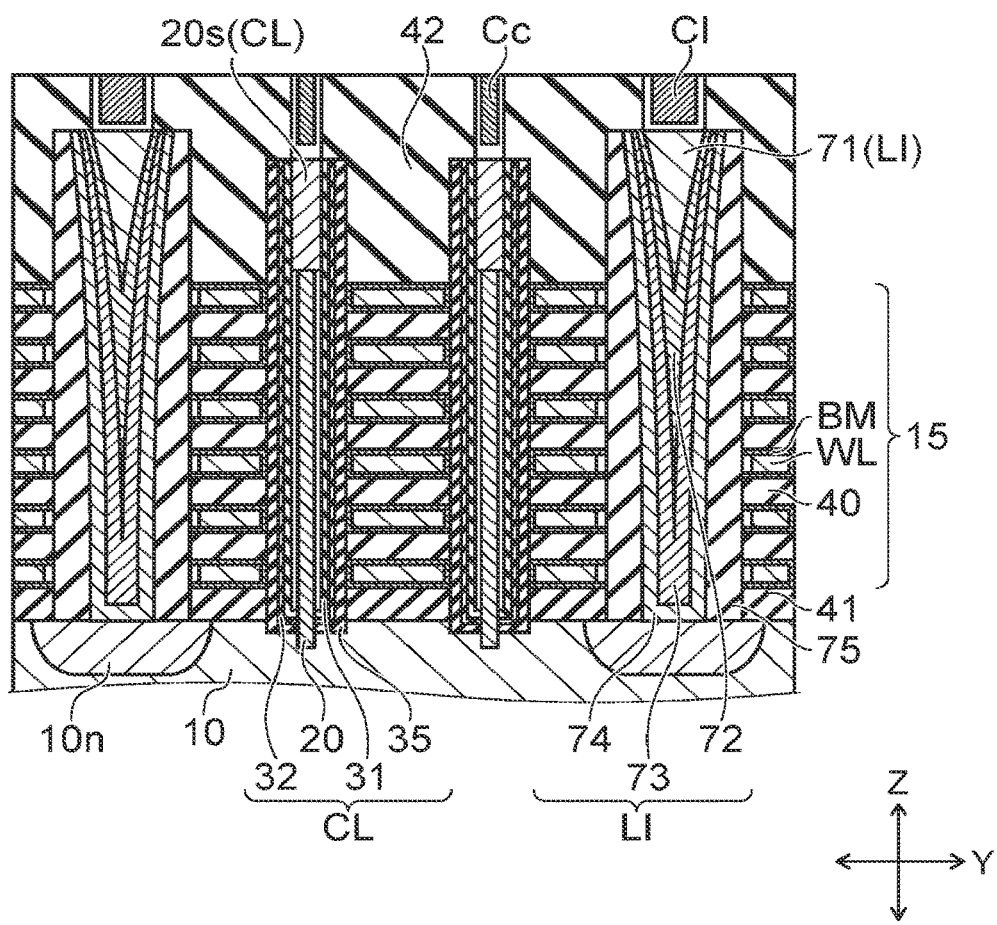
FIG. 10 is a schematic sectional view of the semiconductor memory device of the first embodiment.

Here, as shown in e.g. FIG. 10, the films 71-74 in the interconnect layer LI may be tapered. Also in this case, the films 71-74 have a configuration similar to the configuration described above with reference to FIG. 3A.

A method for manufacturing a semiconductor memory device of this embodiment is described with reference to FIGS. 4A to 7B. With regard to the aforementioned configuration, the description of similar contents is partially omitted.

Figure 4A:
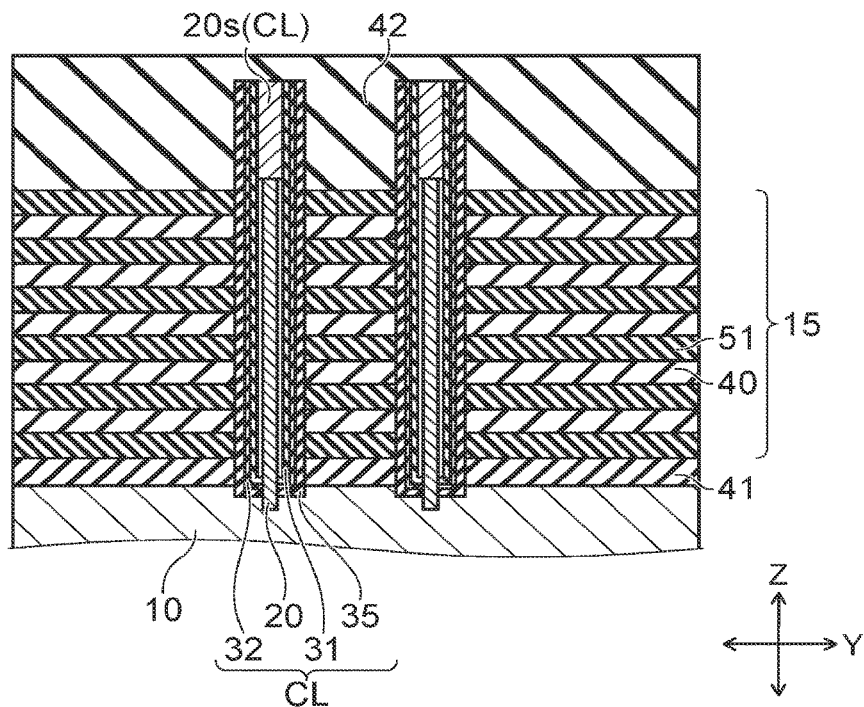

As shown in FIG. 4A, a stacked body 15 is formed on a substrate 10 via an insulating layer 41. A plurality of sacrificial layers 51 (first layers) and a plurality of insulating layers 40 are alternately stacked in the stacked body 15. The number of stacked layers of the stacked body 15 is arbitrary.

The sacrificial layer 51 is made of e.g. silicon nitride film. The insulating layer 40 is made of e.g. silicon oxide film.

Next, an insulating layer 42 is formed on the stacked body 15. The insulating layer 42 is made of e.g. silicon oxide film. Then, a hole penetrating through the insulating layer 42 and the stacked body 15 to the substrate 10 is formed. The films shown in FIG. 2 (such as memory film 30 and channel body 20) are formed on the inner wall of the hole. The channel body 20 is in contact with the substrate 10. Thus, a columnar part CL is formed. Then, the insulating layer 42 is further formed on the upper surface of the columnar part CL and the upper surface of the insulating layer 42.

Figure 4B:
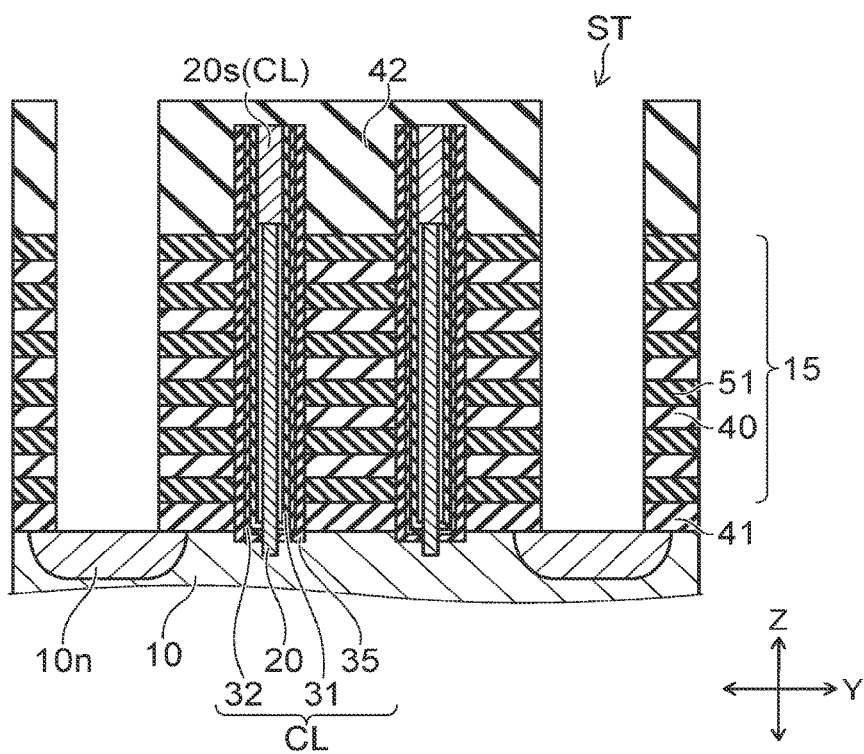

As shown in FIG. 4B, a slit ST penetrating through the insulating layer 42 and the stacked body 15 to the substrate 10 is formed. The slit ST extends in the X-direction. The side surface of the plurality of sacrificial layers 51 and the side surface of the plurality of insulating layers 40 are exposed at the side surface of the slit ST. The substrate 10 is exposed at the bottom surface of the slit ST. Then, the portion of the substrate 10 exposed to the slit ST is doped with e.g. n-type impurity (e.g., phosphorus). Thus, an n-type semiconductor (diffusion layer) region 10n is formed.

As shown in FIG. 5A, the plurality of sacrificial layers 51 is removed by e.g. etching technique through the slit ST. Thus, a space 51s is formed in the portion in which the plurality of sacrificial layers 51 was formed.

As shown in FIG. 5B, a barrier film BM is formed on the wall surface (side surface, upper surface, and lower surface) of the space 51s. An electrode layer WL is formed inside the barrier film BM. The barrier film BM and the electrode layer WL are formed also on the wall surface of the slit ST and the upper surface of the insulating layer 42.

As shown in FIG. 6A, the barrier film BM and the electrode layer WL formed on the wall surface of the slit ST and the upper surface of the insulating layer 42 are removed. Then, an insulating film 75 is deposited and subjected to anisotropic etching such as RIE (reactive ion etching). Thus, an insulating film sidewall 75 is selectively formed on the wall surface part of the slit ST.

As shown in FIG. 6B, a first conductive film 74 is formed on the side surface of the insulating film 75 and the bottom surface of the slit ST. The first conductive film 74 is formed also on the upper surface of the insulating layer 42. The first conductive film 74 is formed integrally in the slit ST and on the upper surface of the insulating layer 42. The first conductive film 74 is made of e.g. a stacked film of titanium and titanium nitride.

An intermediate film 73 is formed integrally on the side surface and upper surface of the first conductive film 74. The intermediate film 73 is separated from the insulating film 75 via the first conductive film 74. The intermediate film 73 is made of e.g. polysilicon.

Figure 7A:
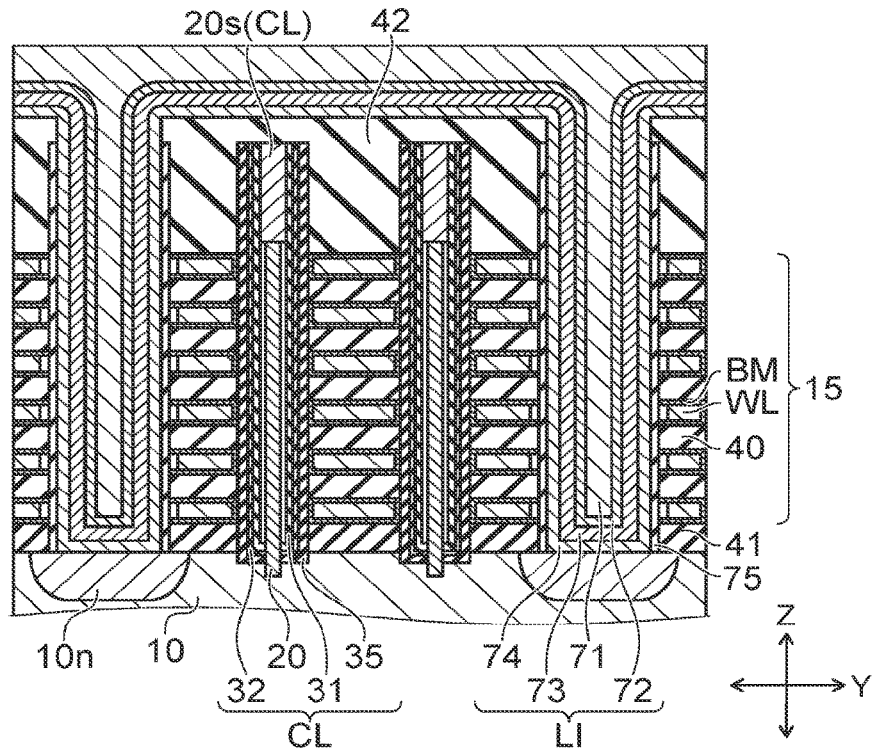

As shown in FIG. 7A, a second conductive film 72 is formed integrally on the side surface and upper surface of the intermediate film 73. The second conductive film 72 is separated from the first conductive film 74 via the intermediate film 73. The second conductive film 72 is made of e.g. a stacked film of titanium and titanium nitride.

A core film 71 is formed integrally on the side surface and upper surface of the second conductive film 72. The core film 71 is separated from the intermediate film 73 via the second conductive film 72. The core film 71 is made of e.g. tungsten.

Figure 7B:
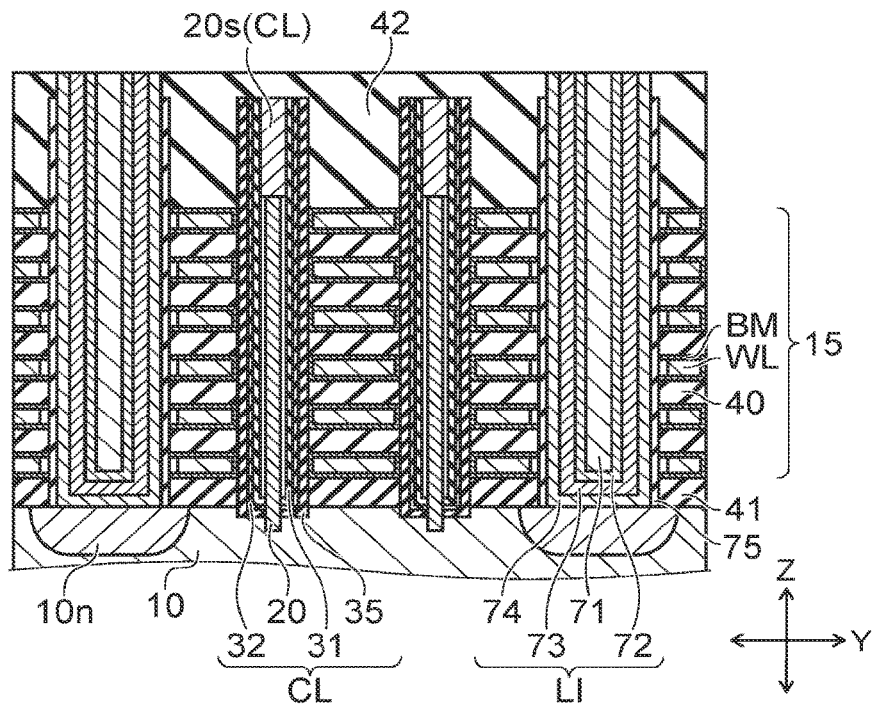

As shown in FIG. 7B, the first conductive film 74, the intermediate film 73, the second conductive film 72, and the core film 71 formed on the insulating layer 42 are removed simultaneously (by a technique such as CMP). Thus, the upper surface of the insulating layer 42 is made flush with the upper surface of the first conductive film 74, the upper surface of the intermediate film 73, the upper surface of the second conductive film 72, and the upper surface of the core film 71.

Next, the insulating layer 42 is further deposited. Then, the contact parts Cc, CI, upper wirings and the like shown in FIG. 3A are formed. Thus, the semiconductor memory device of this embodiment is formed.

Effects in this embodiment are now described.

According to this embodiment, the interconnect layer LI includes a core film 71 made of conductive film (tungsten) having a tensile stress, a second conductive film 72, an intermediate film 73 made of conductive film (polysilicon) having a compressive stress, and a first conductive film 74 sequentially from inside. For instance, in a typical method for forming an electrode, only a metal (e.g., tungsten) and a barrier film (e.g., a stacked film of titanium and titanium nitride) are embedded in the interconnect layer LI. Compared with this typical method, the internal stress (tensile) in the region of the interconnect layer LI is significantly relaxed due to the existence of the intermediate layer. As a result, the increase of the stress applied to the semiconductor memory device can be suppressed.

A large stress applied to the semiconductor memory region causes a strain in the stacked body. Then, the relative position of the upper wiring and the contact parts (Cc, CI) formed on the stacked body may be displaced from the memory hole and the region of the interconnect layer LI. This may lose electrical continuity (make the wiring open). Furthermore, a large warpage may occur in one direction of the wafer. This causes concern about breakage of the wafer. Furthermore, the wafer may have a large difference between the X-direction warpage and the Y-direction warpage. This causes concern about abnormal chucking of the wafer inside the semiconductor manufacturing device in the manufacturing process after the step of forming the part of the interconnect layer LI.

In contrast, according to this embodiment, the stress can be canceled between the films embedded in the region of the interconnect layer LI. Thus, the aforementioned stress originating from the interconnect layer LI can be relaxed. This can suppress the degradation of the device and the occurrence of trouble in the manufacturing process.

For instance, in a conventional interconnect layer LI, the lower layer is made of a silicon-containing material having a compressive stress and covered with a barrier film. The upper layer is made of a metal film having a tensile stress. The following process may be required in this case. The silicon-containing material is embedded in the interconnect layer LI. Then, the upper part of the material is removed by controlling the thickness (height) of the silicon material to be left. Next, the material of the upper layer is formed again in the space formed by the removal. Then, the surface of the upper material is planarized. This may increase the manufacturing cost due to the enhancement of processing accuracy and the complication of the manufacturing process.

In contrast, according to this embodiment, the first conductive film 74, the intermediate film 73, the second conductive film 72, and the core film 71 are formed sequentially. Then, excess films 71-74 can be removed simultaneously by e.g. the CMP process. That is, the increase of manufacturing cost can be suppressed. Furthermore, the increase of the stress applied to the semiconductor memory device can be suppressed.

The aforementioned wafer refers to e.g. the substrate 10 before being diced into individual semiconductor memory devices.

Second Embodiment

An example of the configuration of a semiconductor memory device of this embodiment is described with reference to FIGS. 8 and 9A.

Figure 8:
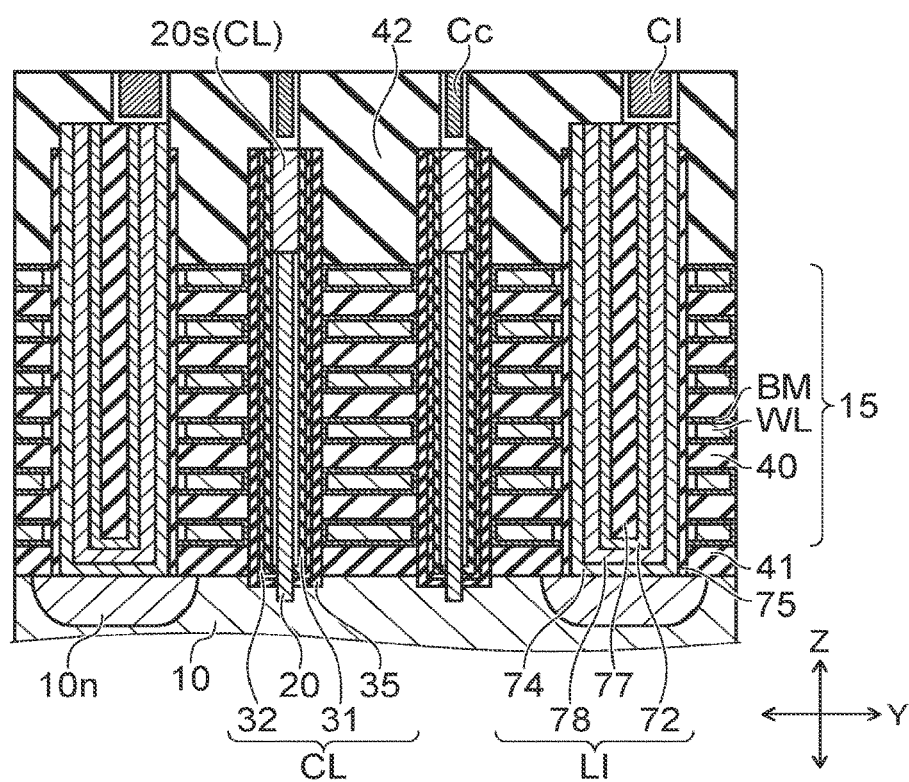
FIG. 8 and FIG. 9A are schematic sectional views of the semiconductor memory device of a second embodiment.
Figure 9A:
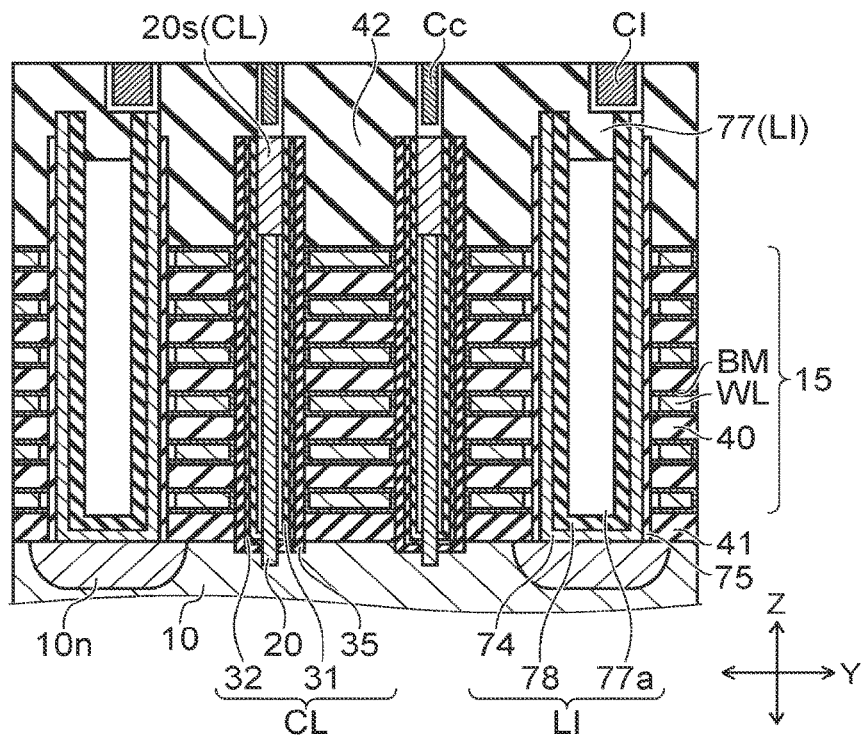

FIGS. 8 and 9A are schematic sectional views of the semiconductor device of this embodiment.

This embodiment is different from the aforementioned embodiment primarily in the configuration of the interconnect layer LI. Thus, the description of the portions similar to those of the aforementioned embodiment is omitted.

As shown in FIG. 8, the core film 77 is provided in the innermost of the interconnect layer LI in the Y-direction. That is, in the Y-direction, the distance between the core film 77 and the plurality of electrode layers WL is larger than the distance between each of the other films 72, 74, 78 and the plurality of electrode layers WL.

An intermediate film 78 is provided integrally between the core film 77 and the first conductive film 74. The intermediate film 78 covers the side surface and lower surface of the core film 77. The upper surface of the intermediate film 78 is flush with the upper surface of the core film 77 and the upper surface of the first conductive film 74.

The core film 77 includes an insulating film such as silicon oxide film. The intermediate film 78 includes a metal such as tungsten. The core film 77 has a film stress (compressive stress) in the direction opposite to that of the intermediate film 78 (tensile stress).

The contact part CI is in contact with at least one of the first conductive film 74 and the intermediate film 78. Thus, the contact part CI is electrically connected to the channel body 20 via the substrate 10.

As shown in FIG. 9A, the core film 77 may include e.g. an air gap 77a. Furthermore, the second conductive film 72 may not be provided. In this case, preferably, at least the upper end of the air gap 77a is lower than the position of the upper surface of the intermediate film 78, and the upper side surface of the intermediate film 78 is covered with the insulating layer 42.

A method for manufacturing a semiconductor memory device including the air gap 77a of this embodiment is described with reference to FIG. 9B. With regard to the aforementioned configuration, the description of similar contents is partially omitted.

As in the manufacturing method of the aforementioned embodiment, as shown in FIGS. 4A to 6A, a stacked body 15 is formed on a substrate 10 via an insulating layer 41. Sacrificial layers 51 and insulating layers 40 are alternately stacked in the stacked body 15.

Next, an insulating layer 42 is formed on the stacked body 15. Then, a hole penetrating through the insulating layer 42 and the stacked body 15 to the substrate 10 is formed. The films shown in FIG. 2 are formed on the inner wall of the hole. Thus, a columnar part CL is formed.

Then, a slit ST penetrating through the insulating layer 42 and the stacked body 15 to the substrate 10 is formed. The substrate 10 exposed to the slit ST is doped with e.g. n-type impurity. Thus, a semiconductor part 10n is formed.

Next, a plurality of electrode layers WL and a barrier film BM are formed in the portion in which the plurality of sacrificial layers 51 was formed. Then, an insulating film 75 is formed on the sidewall of the slit ST.

Figure 9B:
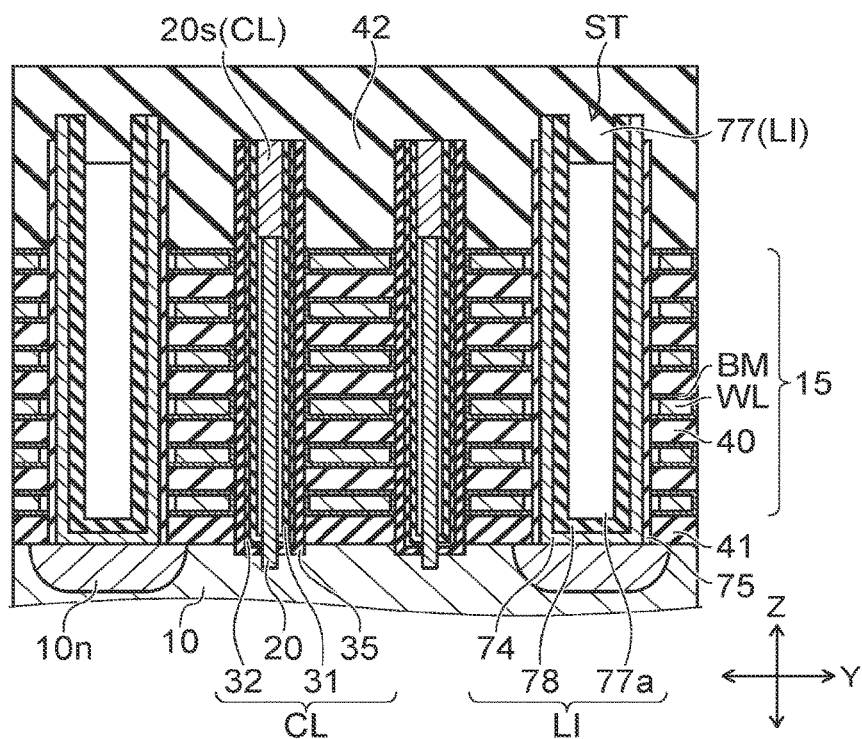
FIG. 9B is a schematic sectional view showing a method for manufacturing the semiconductor memory device of the second embodiment.

As shown in FIG. 9B, a first conductive film 74 is formed on the side surface of the insulating film 75 and the bottom surface of the slit ST. The first conductive film 74 is formed also on the upper surface of the insulating layer 42.

An intermediate film 78 is formed on the side surface and upper surface of the first conductive film 74. The intermediate film 78 is separated from the insulating film 75 via the first conductive film 74. The intermediate film 78 includes a metal such as tungsten.

The first conductive film 74 and the intermediate film 78 formed on the insulating layer 42 are removed simultaneously by e.g. the CMP process. Thus, the upper surface of the insulating layer 42 is exposed. The upper surface of the insulating layer 42 is flush with the upper surface of the first conductive film 74 and the upper surface of the intermediate film 78.

Then, an insulating layer 42 and a core film 77 are formed integrally on the upper surface of the insulating layer 42 and part of the side surface of the intermediate film 78. At this time, the insulating layer 42 and the core film 77 are made of a film having low coverage, such as silicon oxide film formed by plasma CVD technique. Thus, the upper part of the slit ST is occluded with the core film 77 before the slit ST is filled. Accordingly, an air gap 77a is formed inside the intermediate film 78.

Then, the contact parts Cc, CI shown in FIG. 9A are formed. Then, upper wirings and the like are formed. Thus, the semiconductor memory device of this embodiment is formed.

Effects in this embodiment are now described.

According to this embodiment, the interconnect layer LI includes a core film 77 made of insulating film (silicon oxide film) having a compressive stress, an intermediate film 78 made of conductive film (tungsten) having a tensile stress, and a first conductive film 74 sequentially from inside. According to this embodiment, the stress can be canceled between the films embedded in the region of the interconnect layer LI. Thus, the aforementioned stress originating from the interconnect layer LI can be relaxed. This can suppress the degradation of the device and the occurrence of trouble in the manufacturing process. The air gap 77a formed in the core film 77 decreases the stress cancellation effect of the insulating film having a tensile stress of the core film. However, the effect of reducing the stress in the part of the interconnect layer LI can be achieved by decreasing the film thickness (volume) of the intermediate film 78.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A semiconductor memory device comprising:
   a substrate;
   a stacked body provided on the substrate and including a plurality of electrode layers separately stacked on each other;
   a plurality of semiconductor films provided in a plurality of memory holes of the stacked body, extending in a stacking direction of the stacked body, and electrically connected to the substrate;
   an interconnect layer provided in the stacked body, extending in the stacking direction and a first direction crossing the stacking direction, and electrically connected to the semiconductor film via the substrate, the interconnect layer including:
      a core film extending in the stacking direction and the first direction, the core film including tungsten;
      an intermediate film provided integrally between the core film and the plurality of electrode layers and between the core film and the substrate, the intermediate film including polysilicon;
a first conductive film provided integrally between the intermediate film and the plurality of electrode layers and between the intermediate film and the substrate, the first conductive film being in contact with the substrate, and having an upper surface flush with an upper surface of the intermediate film, and the first conductive film including titanium; and
a second conductive film provided integrally between the core film and the intermediate film, the second conductive film being separated from the first conductive film and having an upper surface flush with an upper surface of the core film, the upper surface of the intermediate film, and the upper surface of the first conductive film, and the second conductive film including titanium; and
an insulating film provided between the first conductive film and the plurality of electrode layers, the insulating film extending in the stacking direction and the first direction,
the core film having an outer sides surface and a lower surface which are covered with the second conductive film,
the intermediate film being a film having a uniform composition,
the intermediate film having an outer sides surface and a lower surface which are covered with the first conductive film,
the intermediate film being provided in the stacked body and on the stacked body so as to integrally cover from a lower end part of the insulating film to an upper end part of the insulating film via the first conductive film,
the second conductive film having an outer sides surface and a lower surface which are covered with the intermediate film,
a plurality of regions of the stacked body including the memory holes being arranged in a second direction crossing both the stacking direction and the first direction, and
the interconnect layer being provided in a plate shape between the regions so as to divide the regions in the second direction,
a lower layer of the interconnect layer including a material having a first stress and covered with a barrier film,
an upper layer of the interconnect layer including a material having a second stress,
the core film including the material having the second stress,
the first stress and the second stress being different each other,
one of the first stress and the second stress being a compressive stress,
another of the first stress and the second stress being a tensile stress, and
the core film having a film stress in a direction opposite to a film stress of the intermediate film.

2. The device according to claim 1, wherein at least one of the core film and the intermediate film has conductivity.

3. The device according to claim 1, wherein the core film is electrically connected to the first conductive film via the intermediate film and the second conductive film.

4. The device according to claim 1, wherein a specific resistance of the core film is lower than a specific resistance of the intermediate film.

5. The device according to claim 1, further comprising:
a contact part provided on the interconnect layer, the contact part being in contact with the intermediate film and the first conductive film.

6. The device according to claim 1, wherein the core film includes an air gap.

7. The device according to claim 6, wherein an upper end of the air gap is lower than position of the upper surface of the intermediate film.

8. The device according to claim 1, wherein the core film has a compressive stress.

9. The device according to claim 7, wherein the intermediate film has a tensile stress.

* * * * *